United States Patent [19]

Burnham et al.

[11] Patent Number: 4,683,483

[45] Date of Patent: Jul. 28, 1987

[54] SUBSURFACE ZENER DIODE AND METHOD OF MAKING

[75] Inventors: Stephen R. Burnham; William J. Lillis, both of Tucson, Ariz.

[73] Assignee: Burr-Brown Corporation, Tucson, Ariz.

[21] Appl. No.: 859,454

[22] Filed: May 5, 1986

[51] Int. Cl.[4] .......................................... H01L 29/90
[52] U.S. Cl. ..................................... 357/13; 357/88; 357/90; 357/52
[58] Field of Search ....................... 357/13, 88, 90, 52

[56] References Cited

U.S. PATENT DOCUMENTS

| | | | |
|---|---|---|---|
| 3,881,179 | 4/1975 | Howard, Jr. | 357/13 |
| 4,127,859 | 11/1978 | Nelson | 357/13 |
| 4,136,349 | 1/1979 | Tsang | 357/13 |
| 4,213,806 | 7/1980 | Tsang | 148/187 |

FOREIGN PATENT DOCUMENTS

| | | | |
|---|---|---|---|
| 0082331 | 6/1983 | European Pat. Off. | 357/13 Z |
| 2257823 | 6/1974 | Fed. Rep. of Germany | |
| 2130792 | 6/1984 | United Kingdom | 357/13 |

OTHER PUBLICATIONS

"The Theory and Practice of Microelectronics", Ghandhi, 1968, p. 390, Wiley & Sons, N.Y.

"On-Chip Heater Helps to Stabilize Monolithic Reference Zener", Dobkin, Electronics, 9/16/76, pp. 106–112.

Primary Examiner—Andrew J. James
Assistant Examiner—Jerome Jackson
Attorney, Agent, or Firm—Cahill, Sutton & Thomas

[57] ABSTRACT

A subsurface zener diode is formed in an $N^-$ epitaxial region formed on a P type substrate. The $N^-$ epitaxial region is isolated by a $P^+$ isolation region. An $N^+$ buried layer region is disposed between a portion of the $N^-$ epitaxial region and the P type substrate. A first $P^+$ region is formed in the middle of the $N^-$ epitaxial region at the same time as the $P^+$ isolation regions. Second and third adjacent $P^+$ regions also are formed in the $N^-$ epitaxial region adjacent to and slightly overlapping the first $P^+$ region, all three $P^+$ regions terminating at the $N^+$ buried layer. An $N^+$ region, formed during an emitter diffusion operation, has first and second opposed edges centered within the overlapping portions of the first, second, and third $P^+$ regions. Two other opposed edges of the $N^+$ region extend beyond the other edges of the first $P^+$ region, forming $N^{+N-}$ contacts to the $N^-$ epitaxial region, enabling it to be reverse biased without an additional $N^+$ contact region and a corresponding metal conductor. Masking alignment tolerances in the direction of the $N^+N^-$ overlap are eased, increasing overall processing yields.

8 Claims, 9 Drawing Figures

SUBSURFACE ZENER DIODE AND METHOD OF MAKING

BACKGROUND OF THE INVENTION

The invention relates to improved subsurface zener diodes that are compatible with standard bipolar integrated circuit wafer fabrication processes.

In certain integrated circuit applications, circuits capable of producing reference voltages with low uncompensated thermal drift, very low noise performance, and very high stability with respect to time are essential. This last characteristic avoids the requirement for burn-in processes which otherwise may be necessary to ensure stable operation. Zener diodes that carry their current at or very close to the semiconductor surface exhibit both high values of low frequency noise voltage and unstable voltage performance with respect to time. Subsurface zener diode junctions do not have such undesirable characteristics. There has been a long search in the industry for integrated circuit zener diodes that are capable of being used to produce such reference voltages. Up to now, no prior zener diode that can be fabricated using standard bipolar integrated circuit wafer fabrication processes has been entirely satisfactory. Where extremely low thermal drift reference voltages are needed, it has been necessary for circuit designers to resort to often complex reference circuits known as band gap circuits. U.S. Patent Nos. 4,325,017, 4,249,122, 4,339,707, and 4,064,448, including U.S. Pat. No. 4,524,318 (by one of the present inventors) disclose exemplary of state-of-the-art band gap circuits that are needed to provide adequately stable reference voltages in certain circuit applications.

The state-of-the-art for low noise, stable subsurface integrated circuit compatible zener diodes is shown in U.S. Pat. No. 4,127,859 (Nelson). Other higher noise, less stable subsurface zener diodes are disclosed in U.S. Pat. Nos. 3,881,179 (Howard, Jr.), 4,136,349 (Tsang), and 4,213,806 (Tsang). The above-mentioned Nelson reference discloses the best available subsurface integrated circuit compatible zener diode which, although it is a great improvement over prior subsurface integrated circuit zener diodes, has several shortcomings. A major shortcoming we have discovered of the device shown in the Nelson reference is that it teaches that the edges of the N+ region must be disposed within the center P+ region 22 such that the edges of emitter region 27 stop short of the edges of outer P+ regions 23. We have found that this characteristic of the subsurface zener diode structure shown in the Nelson reference results in lower surface breakdown voltage for the zener diode than is desired and also results in higher series zener resistance than is desirable. This combination of effects limits the amount of current that can flow through the zener diode of the Nelson reference before the onset of surface breakdown, as the voltage developed across the zener resistance as a result of the current flowing through the zener resistance in addition to the subsurface breakdown voltage is applied across the surface portion of the zener junction. Another shortcoming of the Nelson device is that more surface area of the integrated circuit chip is required than is desirable in order to provide an N+N− contact to the N− epitaxial region in which the subsurface zener diode is fabricated, in order to reverse bias the N− epitaxial region. Another shortcoming is that use of the structure and technique disclosed in the Nelson reference requires that close masking tolerance be provided between the N+ "emitter" diffusions and the P+ "isolation" diffusions during manufacture of integrated circuits containing the Nelson zener diode structure. While this does not usually present much difficulty in low-volume, engineering-oriented semiconductor wafer fabrication facilities, those skilled in the art know that in state-of-the-art full scale bipolar integrated circuit high volume production facilities, any tight masking tolerance (i.e., alignment tolerance between different IC masking layers) invariably lowers the manufacturing yield of the integrated circuits produced thereby. It is not customary in standard integrated circuit bipolar manufacturing processes to have to maintain precise mask alignment tolerances between N+ "emitter" type diffusions and P+ isolation type diffusions.

It would be desirable to have an integrated circuit subsurface zener diode that has higher surface breakdown voltage, lower noise at higher currents, and lower internal series impedance than the structure disclosed in the Nelson reference, and which also requires less chip surface area to fabricate the zener diode, requires looser masking tolerances, and provides higher manufacturing yields.

SUMMARY OF THE INVENTION

Accordingly, it is an object of the invention to provide an improved subsurface integrated circuit zener diode structure that has higher surface breakdown voltage and lower series internal resistance than the structure disclosed in the above-mentioned Nelson reference.

It is an object of the invention to provide an improved subsurface integrated circuit zener diode that requires less integrated chip surface area than an equivalent diode having the structure disclosed in the above mentioned Nelson reference.

It is another object of the invention to provide an improved subsurface integrated circuit zener diode that has higher high volume production yields than the subsurface zener diode disclosed in the Nelson reference.

It is another object of the invention to provide a subsurface integrated circuit zener diode structure having lower internal resistance than the subsurface zener diode of the Nelson reference It is another object of the invention to provide an improved integrated circuit subsurface zener diode that avoids or minimizes temperature variations associated with internal resistance of the zener diode.

Briefly described, and in accordance with one embodiment thereof, the invention provides an integrated circuit subsurface zener diode formed by means of a standard bipolar integrated circuit manufacturing process wherein the subsurface junction is formed between an N+ emitter type diffused region and a P+ isolation region formed in an isolated N− type epitaxial region over an N+ buried layer region, wherein a portion of the peripheral edge of the N+ emitter region is aligned with a relatively lightly doped, highly outdiffused portion of the P+ isolation type diffused region and another portion of the N+ emitter type region extends across the outer edge of the P+ isolation type diffusion to make an N+N− contact to the isolated N− epitaxial region. The first P+ isolation type region is slightly overlapped by two adjacent P+ type isolation regions. Peripheral edge portions of the N+ emitter region are precisely centered within the overlapping regions of the first P+ isolation region and the two adjacent P+ type isolation regions, resulting in minimum surface breakdown of the zener diode junction and also resulting in minimum internal series resistance of the subsurface zener diode structure. P+ "base" type regions are formed in the centers of the second and third P+ isolation type regions in order to provide thin oxide cuts through which low resistance electrical contact can be made to achieve low dynamic internal resistance of the subsurface zener diode.

DESCRIPTION OF THE INVENTION

Figure 1:
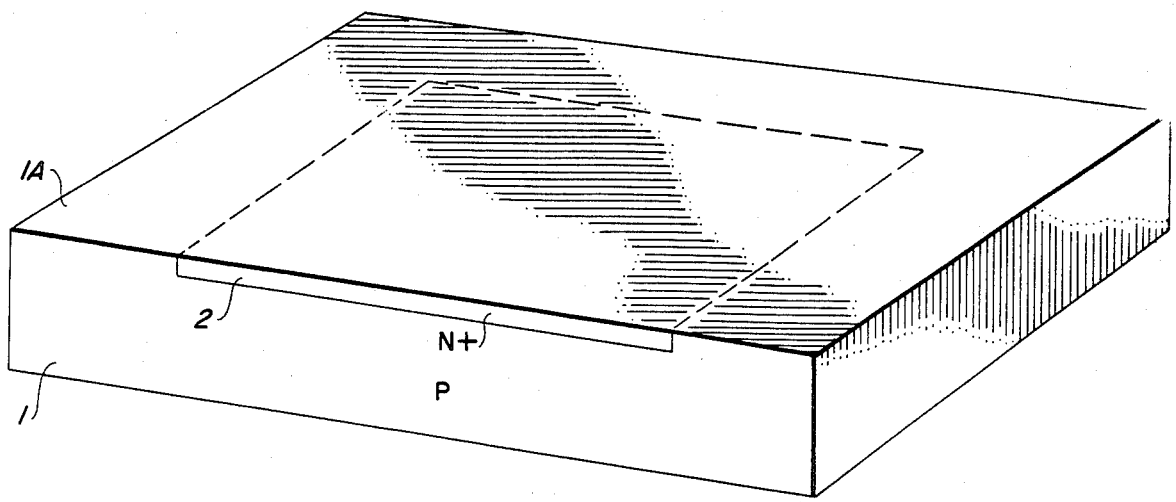
FIG. 1 is a partial perspective view illustrating diffusion of a buried layer into a substrate in accordance with the method of making the subsurface zener diode of the present invention

Referring now to the drawings, but before describing the complete structure of the subsurface zener diode of the present invention and its distinguishing characteristics over the closest prior art, it will be helpful to describe basically how the subsurface zener diode is fabricated using a "standard" or conventional bipolar integrated circuit manufacturing process.

It is to be understood that the term "zener diode" as used herein and in the claims is used to refer to a diode that has been reverse biased by an amount sufficient to cause reverse breakdown in accordance with either the avalanche breakdown phenomena or the zener breakdown phenomena. Those skilled in the art commonly use the terms "zener diode" and "avalanche diode" interchangeably.

Figure 2:
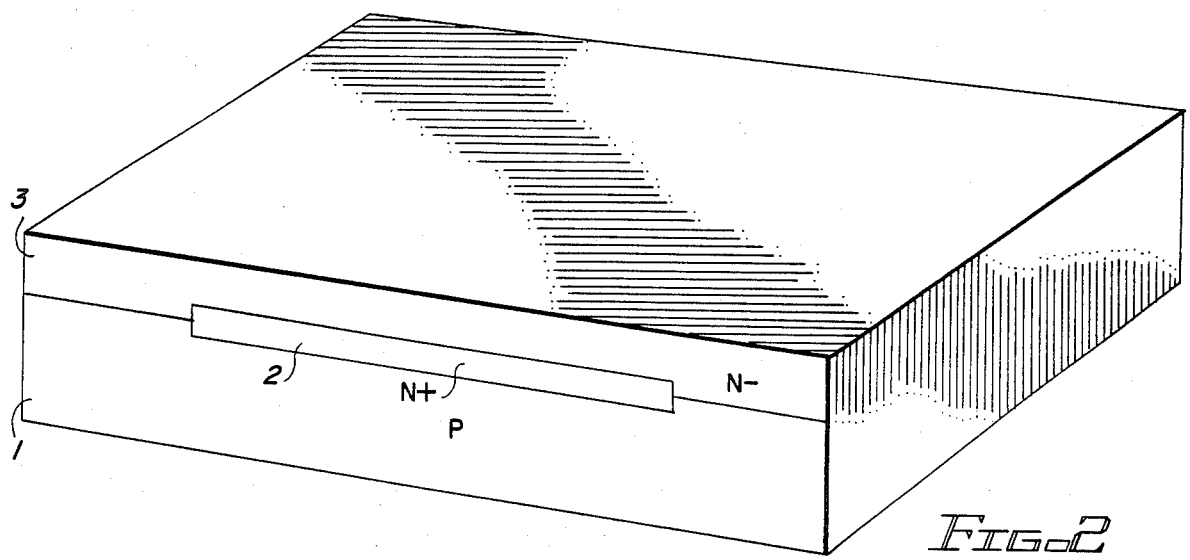
FIG. 2 is a partial perspective view illustrating formation of an epitaxial layer on the structure of FIG. 1.

Referring first to FIG. 1, after a suitable masking operation, a conventional N+ type buried layer region 2 is diffused into the upper surface 1A of P type substrate 1. An oxide layer (not shown) that was used to define the buried layer region 2 now is stripped away to allow growth of a lightly doped N− type epitaxial layer 3, as shown in FIG. 2. (It is to be noted that the partial perspective views of FIGS. 1-4 show a small section of one portion of an integrated circuit chip that contains numerous other integrated transistors, resistors, etc.)

Figure 3:
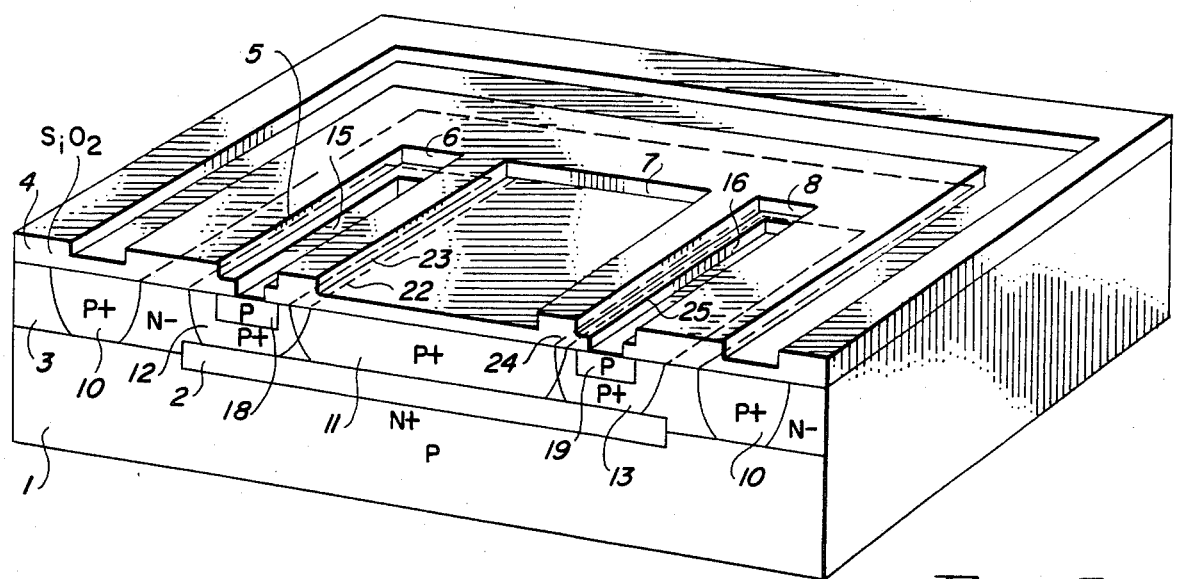
FIG. 3 is a partial perspective view illustrating formation of "isolation type" diffusions and "base type" diffusions and certain oxide openings required therefor.

After the N− epitaxial layer 3 has been formed, and a silicon dioxide ($SiO_2$) layer 4 has been formed thereon, a closed loop opening 5 is photo-etched in oxide layer 4 to define the heavily doped P+ closed loop isolation region 10 that extends through the N− epitaxial layer 3 to the P type substrate 1. Simultaneously, openings 6, 7, and 8 are made in the oxide layer 4 to define rectangular P+ regions 12, 11, and 13, respectively. Using a suitable initial impurity deposition and a suitable high-temperature diffusion or drive-in operation, closed loop P+ isolation region 10 is formed, simultaneously with P+ regions 11, 12, and 13, as shown in FIG. 3. Isolation region 10 extends from the upper surface of epitaxial layer 3 to the upper surface of P type substrate 1. P+ regions 11, 12, and 13 extend through epitaxial N− region 3 into N+ buried layer 2, and thus are electrically isolated from P type substrate 1.

The upper surface outline of P+ region 11 is shown as rectangular, although other shapes obviously could be used. P+ regions 12 and 13 also are shown as having rectangular outlines and are of the same length as center region 11 in the drawings. However P+ regions 12 and 13 could be of various other lengths and/or shapes.

As those skilled in the art know, deep diffusions of the type typically used for forming isolation regions in integrated circuits (referred to herein simply as isolation type diffusions or isolation type diffused regions) diffuse laterally (i.e., "outdiffuse") as well as downward from the portion of the semiconductor surface defined by the oxide opening through which the impurities are initially diffused or implanted into the exposed semiconductor surface. Thus, such isolation type diffused regions are most heavily doped in their central portions, and the impurity concentration (P type) gradually decreases toward the laterally "outdiffused" portions. As the isolation diffusions are carried out, the outermost parts of the outdiffused portions of center P+ region 11 and P+ regions 12 and 13 overlap slightly. More specifically, dotted lines 22 and 23 define a common or overlapped "peripheral", lightly doped portion of P+ regions 11 and 12. Dotted lines 24 and 25 in FIGS. 3 and 4 define a lightly doped region where outdiffused peripheral portions of center region 11 and right region 13 overlap slightly.

In accordance with an important aspect of the present invention, the metallurgical junction edges 28-1 and 28-2 are precisely centered within the surface boundaries of the two lightly doped P+ overlapping regions defined by dotted lines 22 and 23, and the overlapping region defined by dotted lines 24 and 25, respectively. (See FIG. 4). The curves shown in FIG. 8 illustrate the composite lateral surface impurity concentration across the overlapped regions, such as the one between dotted lines 24 and 25 or the one between dotted lines 22 and 23.

Figure 8:
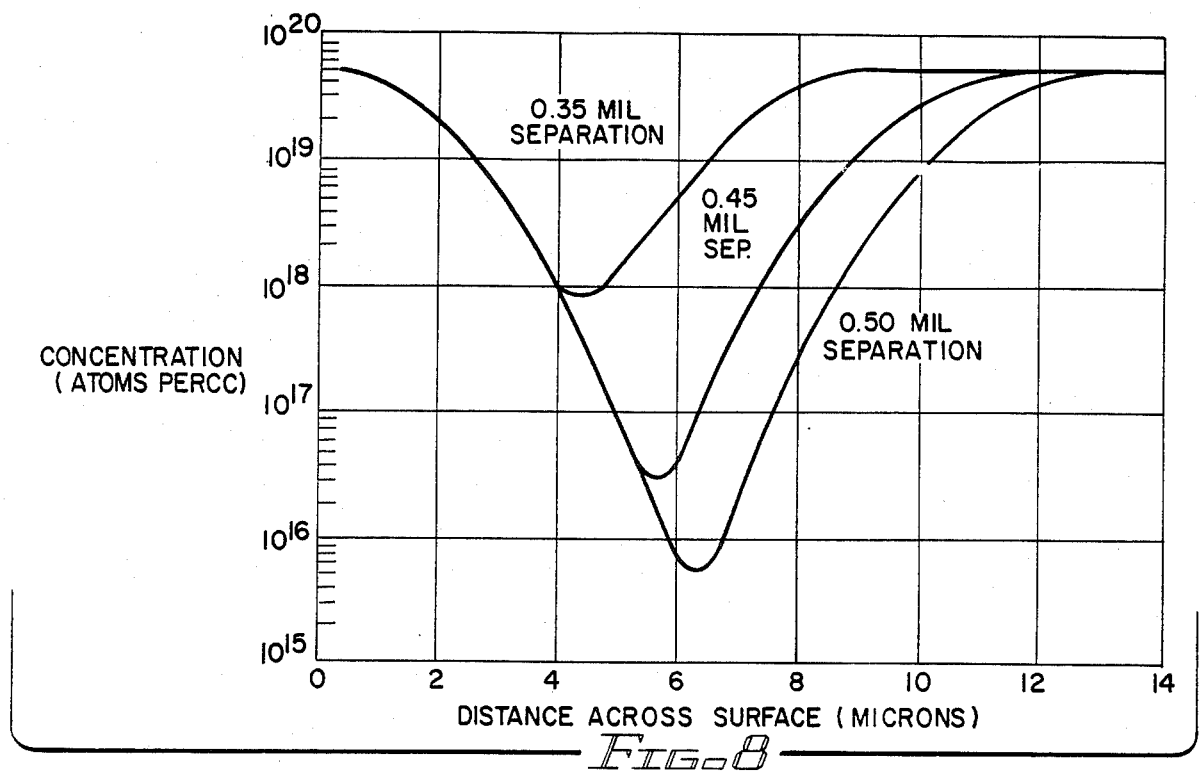
FIG. 8 is a graph illustrating the composite lateral impurity concentration in the peripheral, lightly doped, overlapping P+ regions within which the edges of the N+ emitter region are centered, for several different spacings between the oxide cuts that define the P+ isolation regions.

The upper curve in FIG. 8 corresponds to the composite lateral surface impurity concentration of the overlapped region wherein the separation between the oxide openings (not shown) that initially define the locations of P+ region 11 and P+ region 13 is 0.35 mils. The middle curve corresponds to the composite lateral surface impurity concentration if the spacing between the oxide cuts defining the location of P+ region 11 and P+ region 13 is 0.45 mils, and the bottom curve shows the impurity concentration when the oxide cuts referred to are 0.5 mils apart. The upper curve corresponds to the greatest width of the P+ overlap region, while the bottom curve corresponds to the narrowest overlap region.

Figure 9:
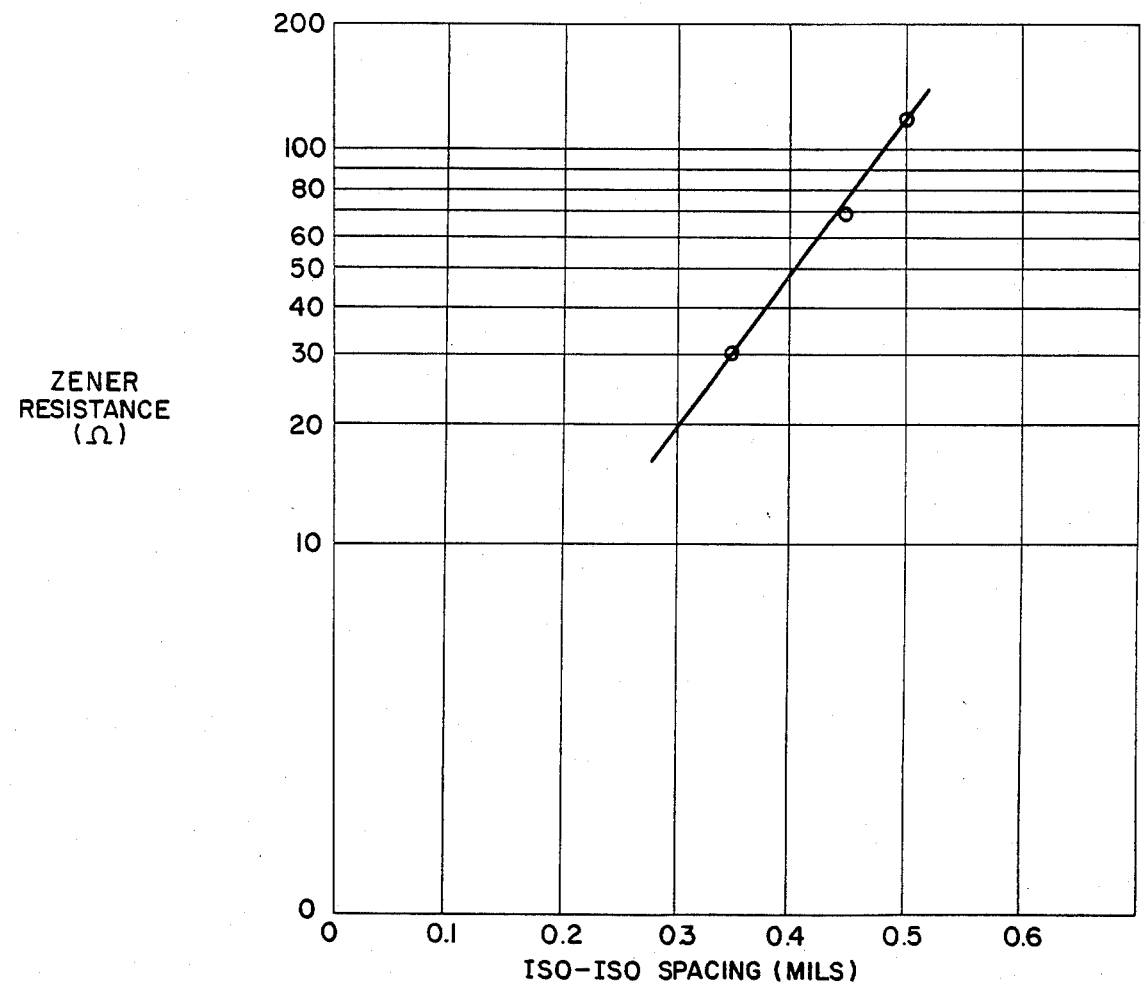
FIG. 9 is a graph of series internal resistance of the subsurface zener diode structure of the present invention for the same device spacings for which the composite lateral impurity concentration curves shown in FIG. 8 is plotted.

The impurity concentration in each case is minimum at the geometric center of the P+ overlap region, so the geometric center of the overlap region is the ideal location for the metallurgical junction of the N+ emitter region 21. The curves in FIG. 8 show that the closer together the P+ regions 11 and 13 are, the higher the minimum concentration is at the center of the overlap region and naturally, the lower the surface breakdown voltage is. Increasing the separation between the P+ regions 11 and 13 decreases the minimum surface impurity concentration in the P+ overlap region, and also substantially increases the internal series zener resistance, as shown in FIG. 9. A trade-off needs to be made to provide the combination of spacing between the P+ region 11 and the P+ region 13 that results in the highest operating current for the zener diode without causing surface breakdown, which of course, produces high noise.

In the Nelson device, the impurity concentration distribution across the P+ overlap region is generally as shown in FIG. 8, but Nelson does not use this characteristic to achieve higher surface breakdown voltages. All the overlap region accomplishes in the Nelson structure is to increase the internal series zener resistance over what is achieved by applicant's invention for a particular value of surface breakdown voltage.

Those skilled in the art know that as the isolation type diffusion operations are performed, an oxide will grow on the upper surface of the epitaxial layer 3 over the exposed semiconductor surface. The next step in the process of the present invention is to photo-etch openings 15 and 16 (FIG. 3) in the regrown oxide to define regions in which "P type" regions 18 and 19 are diffused. Obviously, the diffusion of more P type impurities into P+ regions 12 and 13 does not result in regions 18 and 19 that are more lightly doped than the P+ regions 12 and 13; it is to be understood that regions 18 and 19 are referred to as P type herein simply because they are formed during the base diffusion, which produces relatively lightly doped P type regions. The oxide openings 15 and 16 are photo-etched at the same time that the openings defining base regions of NPN transistors are defined elsewhere in the integrated circuit. P type regions 18 and 19 are formed simultaneously with the P type base regions of bipolar NPN transistors formed elsewhere in the integrated circuit. This type of P type diffusion is hereinafter referred to as a "base diffusion".

After the "base" diffusions are complete, the partial perspective view of the subsurface zener diode of the present invention appears generally as indicated in FIG. 3.

Figure 4:
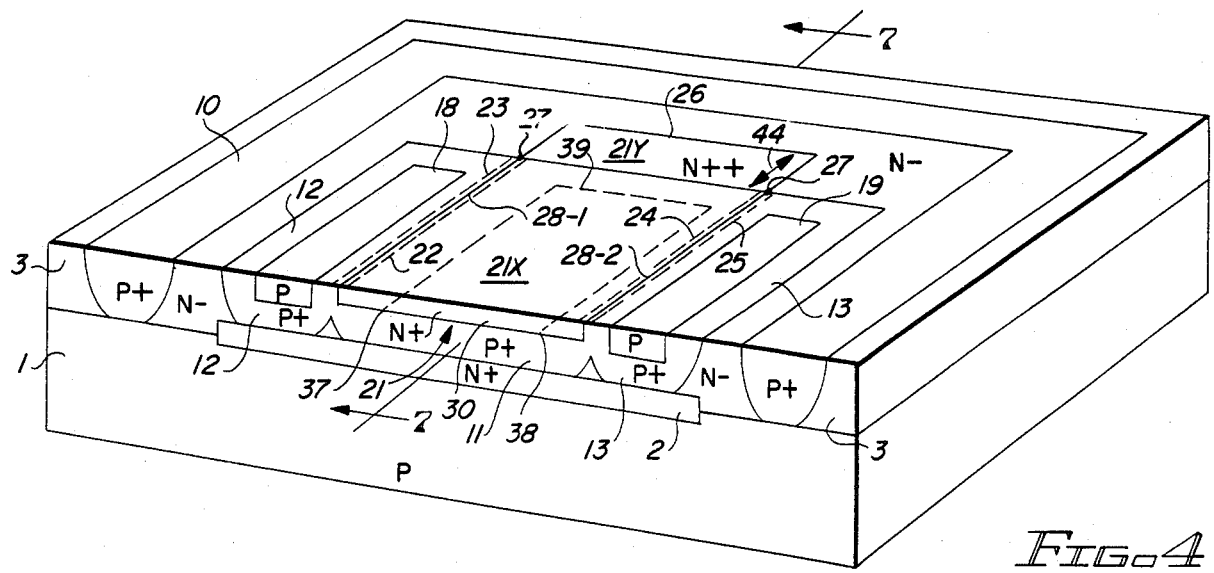
FIG. 4 is a partial perspective view of the structure shown in FIG. 3 illustrating the structure of the subsurface zener diode device of the present invention, the oxide layer and metal layers being omitted for clarity.

Referring now to FIG. 4, the next steps in the manufacturing process involve photomasking operations to define the N+ emitter regions of the bipolar NPN transistors being formed elsewhere in the integrated circuit. In the subsurface zener diode structure of the present invention, N+ region 21 is formed in centered relationship to P+ region 11, as shown in FIG. 4. Note that in FIG. 4 the oxide layer has been omitted for clarity.

More specifically, N+ region 21 is formed so that its left edge 28-1 lies between above-mentioned dotted lines 23 and 24, in the lightly doped P type overlapping portion of the P type regions 11 and 12. Right-hand edge 28-2 of N+ region 21 lies between dotted lines 24 and 25, which define the lightly doped overlapping peripheral portions of P type regions 11 and 13. This is in contrast to the teachings of the above-mentioned Nelson reference, wherein it is taught and claimed that the outer P+ region stops short of the edge of the N+ emitter region. A central portion 21X of N+ emitter type region 21 lies within the "unitary P type region 11, 12, 13," and two end portions of N+ region 21 (see both FIGS. 4 and 7) extend beyond the unitary P type region 11, 12, 13 into the isolated portion of N− epitaxial layer 3 surrounded by P+ isolation region 10. Thus, an N+N− surface junction outside of P+ region 11 is defined by portions 26 of the periphery of N+ region 21, and an N+P− surface junction is formed inside P+ region 11 by the peripheral portions 28-1 and 28-2 of N+ region 21.

The N+N− junction ensures a very low resistance electrical connection of N+ region 21 to the isolated N− epitaxial region surrounded by P+ isolation region 10. Thus in the structure shown in FIG. 4, the entire peripheral portion of N+ region 21 either consists of either N+N− junction, which obviously cannot undergo any kind of reverse junction breakdown, or consists of P−N+ surface junction, which has a substantially higher avalanche or zener breakdown voltage than the subsurface portion 30 of the PN junction formed between N+ region 21 and P+ region 11.

Figure 5:
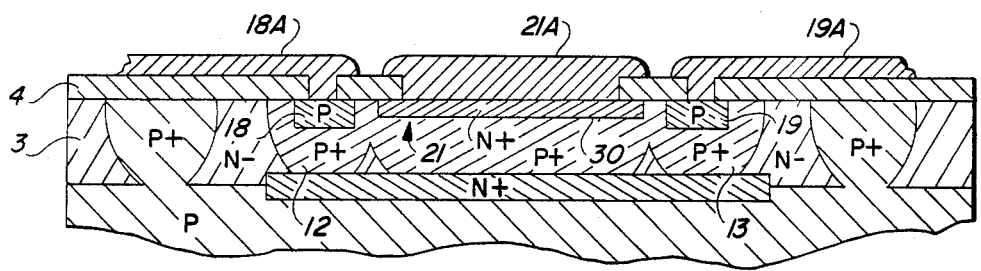
FIG. 5 is a section view of the completed subsurface zener diode structure.

Thus, avalanche or zener breakdown will be confined to the subsurface N+P+ portion 30 of the PN junction between P+ region 11 and N+ region 21, as long as the lateral voltage drops between terminal 18A (or 19A) in FIG. 5 and subsurface junction 30 are not too great.

As an example, dotted line 39 in FIG. 4 designates a hypothetical "boundary" that defines a subsurface portion of the PN junction between regions 11 and 21 at which the junction 30 is of the N+P+ type. The zener breakdown voltage or avalanche breakdown voltage of the heavily doped P+ material of the subsurface junction 30 is necessarily lower than that of the peripheral more lightly doped P− material of the subsurface junction so a very stable, low noise zener diode is obtained.

The final steps in the fabrication of the subsurface zener diode of the present invention are illustrated in the partial sectional view of FIG. 5, wherein suitable openings are made in the oxide layer 4, and a metalization pattern then is provided on the surface of the integrated circuit. Metal layer 18A makes electrical contact to P+ region 12 by making electrical contact to P type region 18. Metal layer 21A makes electrical contact to N+ region 21. Metal layer 19A makes electrical contact to P+ region 13 by making contact to P type region 19.

Figure 7:
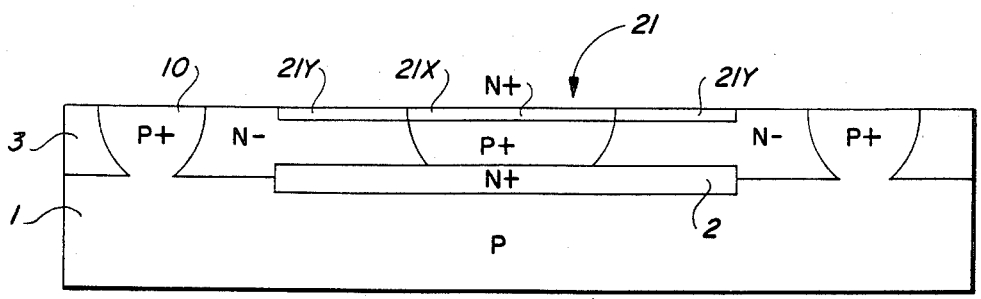
FIG. 7 is a section view along section line 7—7 of FIG. 4.

A distinguishing feature of the above-described subsurface zener diode over the above mentioned Nelson reference is the provision of at least one extension 21Y in FIG. 7 of N+ region 21 beyond the edge of the P+ region 11, thereby providing electrical contact between N+ region 21 and the isolated N− epitaxial region in which the zener diode is formed. In the above-mentioned Nelson reference, which clearly teaches that the N+ emitter type region is formed inside the center P+ isolation type region, one skilled in the art would immediately know that an additional N+ emitter type "contact" region must be formed in the N− epitaxial layer, and an additional metal conductor must be provided to apply a bias voltage to the isolated N− epitaxial region in which the zener diode is formed in order to properly bias it. This would be necessary because the N− epitaxial region must be positively biased relative to all of the adjacent P type regions, and cannot be left electrically "floating". The additional N+ contact region and metal bias require significantly more chip area than applicant's structure.

An advantage of the low internal series resistance of the subsurface zener diode structure of the present invention is that the relatively strong temperature coefficient of the internal series resistance has less affect on the terminal voltages of the zener diode than would be the case if the internal zener resistance were high. This alleviates the temperature compensation problems that would have to be dealt with otherwise.

Another advantage of the subsurface zener diode structure of the present invention is that alignment of the N+ region 21 in the directions indicated by arrows 40 in FIG. 4 is not at all critical. However, in the structure described in the Nelson reference, an outer P+ isolation type diffused region, which slightly overlaps the inner P+ isolation type diffused region, entirely surrounds the inner P+ region. Substantial misalignment of the N+ in the Nelson patent region in any direction relative to the P+ isolation regions could result in a peripheral portion of the N+ region extending into heavily doped P type material near the surface, causing occurrence of lower surface breakdown voltage than the subsurface breakdown voltage, and thereby resulting in a noisy zener diode that in turn would cause the integrated circuit to not operate within predetermined specifications.

Another advantage of the structure shown in the drawings is that two external connections 18A and 19A are made to the anode of the subsurface zener diode structure. By way of distinction over the Nelson reference, only a single anode connection to a metal layer on the surface of the integrated circuit is shown.

The availability of separate anode connections allows the zener diode to be used in a "force and sense" mode. Stated differently, a "Kelvin connection" can be made to the zener diode. As those skilled in the art realize, what this means is that the avalanche or breakdown current flowing through the subsurface zener diode, during normal zener diode operation, essentially all flows through the cathode (N+) metal connection 21A and only one of the metal anode connections, for example 18A. The reference voltage produced by the zener diode is applied to the input of a high impedance circuit, such as an operational amplifier, by means of the other anode conductor 19A, which draws essentially zero current. Then, there is essentially no resistive voltage drop between the anode side of the true metallurgical junction 30 of the subsurface zener diode and the external terminal 19A.

Figure 6:
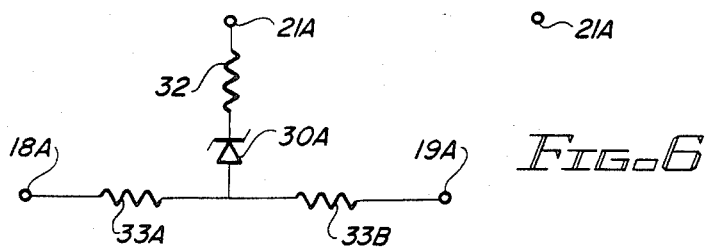
FIG. 6 is a schematic circuit diagram representing a lumped circuit equivalent of the subsurface zener diode of FIG. 4.

This can be understood better with reference to FIG. 6, in which the terminals 21A, 18A, and 19A correspond to the terminals represented by the same reference numerals in FIG. 5. Reference numeral 32 designates the bulk resistance of the N+ region 21 plus other resistance effects of diode 30A in its breakdown mode. Reference numeral 30A designates an "idealized" zener diode formed by the subsurface PN junction 30 (FIG. 4). Resistor 33A designates the equivalent resistance between metal layer 18A in FIG. 4 and the subsurface PN junction 30, and resistor 33B designates the equivalent resistance between metal conductor 19A and the subsurface junction 30.

Typical values of resistors 33A and 33B for one of the assignee's standard IC manufacturing processes are about 70 ohms each, and a typical value of resistor 32 is about 10 ohms. The zero voltage drop referred to above would be the voltage drop across resistor 33B in FIG. 6. This voltage drop would be zero, because the reference voltage produced on conductor 19A would be applied to a high input impedance amplifier circuit and therefore would draw essentially zero current. This is desirable because the effects of thermal variation of the anode resistance do not appear in the reference voltage, and therefore do not have to be compensated for. The relatively large voltage drop across resistor 33A would not effect the reference voltage produced on conductor 19A.

In the above-described structure for the above-referred-to IC manufacturing process, surface concentrations, can be as follows. The impurity concentration of N+ region 21 can be about $3 \times 10^{20}$ atoms per cubic centimeter. Tne surface impurity concentraton of the isolation type diffused regions 10, 11, 12, and 13 can be about $5 \times 10^{19}$ atoms per cubic centimeter. (The diffusion of further P type impurities into the surface of P+ regions 12 and 13 during the diffusion of the base regions elsewhere in the integrated circuit slightly increases the P type impurity concentration in regions 12 and 13, but not significantly so.) The buried layer impurity concentration is approxmatately $10^{20}$ atoms per cubic centimeter None of these impurity concentration levels is critical as far as the stable operation of the subsurface zener diode of the present invention is concerned, and none need to be varied in any way from the values of the particular "standard" or conventional bipolar integrated circuit manufacturing process being used.

For the above-described manufacturing process, very stable zener breakdown voltages of 6.5 volts were obtained for diode currents of up to 20 milliamperes. The values of the resistances 33A and 33B (FIG. 6) were found to be about 70 ohms. These values were obtained for a structure in which the size of the mask openings defining the N+ region 21 was 1.5 mils by 0.95 mils, the mask opening defining P+ region 11 is 0.4 mils by 0.45 mils, and the size of the mask openings defining the outer P+ regions 12 and 13 were 0.5 mils by 0.7 mils. The actual size of the final outdiffused N+ region 21 (each edge of which laterally outdiffuses 0.05 mils) is 1.6 mils by 1.05 mils, the P+ regions 12 and 13 (each edge of which laterally outdiffuses 0.25 mils) are 1.0 mils by 1.2 mils, and P+ region 11 is 0.9 mils by 0.95 mils.

The described subsurface zener diode provides higher surface breakdown voltage and stable, low noise reference voltages at higher currents with lower series internal resistance than the Nelson device and provides a Kelvin contact. The described surbsurface zener diode also can be manufactured with higher yields.

The combination of advantages provided by the described zener diode structure obviates the need to use the above-mentioned expensive band gap circuits in many applications, substantially lowering the cost of the integrated circuits needing a very stable, low noise internal voltage reference.

While the invention has been described with reference to a particular embodiment thereof, those skilled in the art will be able to make various modifications to the described embodiments without departing from the true spirit and scope thereof. It is intended that all variations of the invention wherein elements or steps are utilized that perform substantially the same function in substantially the same way to achieve substantially the same result are to be considered within the scope of the present invention. For example, some of the benefits of the invention can be attained in different manufacturing processes wherein isolation of the N type epitaxial region is achieved otherwise than by provision of P+ isolation diffusions, for example, by "V groove" isolation. Moreover, it is not essential that the P+ region 11 be formed by an isolation type diffusion, nor that it extend all the way to the P type substrate. All that is necessary is that the central portion in which the subsurface junction 30 appears be very heavily doped compared to the lightly doped overlapping peripheral regions wherein the peripheral edges of the N+ region 21 are centered. Similarly, the "outrigger" P type regions only need to fulfill the requirement that they have lightly doped peripheral portions that overlap the lightly doped peripheral portions of the N+ region 21. If their central portions are also lightly doped, this will result in high lateral resistance, i.e., high values of resistances 33A and 33B in FIG. 6, which will result in high noise surface breakdown at higher diode currents, but low current operation will be the same as for the desired embodiment of the invention. As an example of a different type of isolation of the N− region in which the P+ region 11 is diffused, the well-known dielectric isolation technique could be used. If dielectric isolation is used, the starting material for the process does not consist of either of the structures shown in FIGS. 1 or 2, but instead consists of a wafer having a plurality of N− dielectrically isolated islands supported on a polycrystalline silicon substructure, as is well known to those skilled in the art. In this event, the isolation regions 10 as shown in FIG. 3, are, of course, not required. However, a P+ region such as 11 can be diffused all the way to the SiO$_2$ dielectrically isolated N− island, and the two "outrigger" P+ regions such as 12 and 13 can be diffused into the N− island at the same time, in precisely the same manner as described above. The N+ region 21 is provided exactly as shown in FIG. 4. In a CMOS structure the P type well diffusions in the usual N type substrate, could be utilized to make a P type overlapping region with relatively low concentrations, with an N type source region having its metallurgical junction centered in the overlap region to provide a stable subsurface zener diode structure.

We claim:

1. A subsurface zener diode including:
    (a) a P type substrate;
    (b) a lightly doped N type region on the P type substrate;
    (c) means for electrically isolating the N type region from any other lighly doped N type region on the P type substrate;
    (d) a heavily doped first P type region disposed in the lightly doped N type region and having a relatively heavily doped inner portion and a relatively lightly doped laterally outdiffused peripheral portion;
    (e) a second P type region disposed in the lightly doped N type region and having a lightly doped peripheral portion, at least a part of which overlaps a portion of the lightly doped laterally outdiffused peripheral portion of the first P type region;
    (f) a heavily doped N type region disposed partly in the first P type region and having a peripheral portion including a first peripheral portion, the first peripheral portion being centrally located entirely in the lightly doped laterally outdiffused peripheral portion of the first P type region and the lighlty doped peripheral portion of the second P type region,
    wherey no peripheral portion of the heavily doped N+ region is disposed in P type semiconductor material that is more heavily doped than P type semiconductor material adjacent to a subsurface portion of the PN junction between the heavily doped N+ region and the first P type region.

2. The subsurface zener diode of claim 1 wherein the isolating means includes a heavily doped P type isolation diffusion region extending from an upper surface of the lightly doped N type region to the P type substrate.

3. The substrate zener diode of claim 2 including a heavily doped N type buried layer region disposed between an approximately centered portion of the lightly doped N type region and the P type substrate, wherein the heavily doped first P type region has a P type doping profile essentially identical to the doping profile of the heavily doped P type isolation diffusion region and extends from the upper surface of the lightly doped N type region to an upper surface of the heavily doped N type buried layer region.

4. The subsurface zener diode of claim 3 including a third P type region disposed in the lightly doped N type region and having a lightly doped peripheral portion, a part of which overlaps a portion of the lightly doped laterally outdiffused peripheral portion of the first P type region and having a P type doping profile that is essentially similar to that of the first P type region, an edge portion of the heavily doped N type region being centrally located in that overlapping portion.

5. The subsurface zener diode of claim 4 including a metal cathode conductor electrically connected to the heavily doped N type region, a first anode conductor electrically connected to the second P type region and a second anode conductor electrically connected to the third P type region.

6. The subsurface zener diode of claim 1 wherein the heavily doped N type region consists of the first peripheral portion and a second peripheral portion, the second peripheral portion being located in the lightly doped N type region and forming a low resistance electrical contact that biases the lightly doped N type region at the same potential as the heavily doped N− region.

7. A subsurface zener diode including:
    (a) a substrate;
    (b) a lightly doped first region of a first impurity type on the substrate;
    (c) means for electrically isolating the first region from any other region of the substrate;
    (d) a heavily doped second region of a second impurity type disposed in the first region and having a relatively heavily doped inner portion and a relatively lightly doped laterally outdiffused peripheral portion;
    (e) a third region of the second impurity type disposed in the first region and having a lightly doped peripheral portion, at least a part of which overlaps a portion of the lightly doped laterally outdiffused peripheral portion of the second region;
    (f) a heavily doped fourth region of the first impurity type disposed in the second region and having a peripheral portion including a first peripheral portion, the first peripheral portion being entirely centrally located in a region containing the lightly doped laterally outdiffused peripheral portion of the second region and the lightly doped peripheral portion of the third region, wherey no peripheral portion of the heavily doped fourth region is disposed in second impurity type semiconductor material that is more heavily doped than second impurity type semiconductor material adjacent to a subsurface portion of the PN junction between the fourth region and the second region.

8. The subsurface zener diode of claim 7 wherein the heavily doped fourth region of the first impurity type consists of the first peripheral portion and a second peripheral portion, the second peripheral portion being located in the first region and forming a low resistance electrical contact that biases the first region at the same potential as the fourth region.

* * * * *